(12) United States Patent
Kummerl et al.

(10) Patent No.: US 8,053,876 B2
(45) Date of Patent: Nov. 8, 2011

(54) MULTI LEAD FRAME POWER PACKAGE

(75) Inventors: Steven A Kummerl, Carrollton, TX (US); Bernhard P Lange, Freising (DE); Anthony L Coyle, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/573,196

(22) Filed: Oct. 5, 2009

(65) Prior Publication Data

US 2010/0019361 A1    Jan. 28, 2010

Related U.S. Application Data

(60) Continuation of application No. 11/831,458, filed on Jul. 31, 2007, now abandoned, which is a division of application No. 11/074,278, filed on Mar. 7, 2005, now abandoned.

(51) Int. Cl.
*H01L 23/495* (2006.01)
*H01L 21/00* (2006.01)
*H05K 7/20* (2006.01)

(52) U.S. Cl. ........... 257/675; 257/692; 257/E23.031; 257/E23.051; 257/E23.06; 361/710; 361/813; 438/122; 438/123

(58) Field of Classification Search ............... None
See application file for complete search history.

(56) References Cited

U.S. PATENT DOCUMENTS

| | | | | |
|---|---|---|---|---|
| 5,377,077 A * | 12/1994 | Burns | ............ | 361/704 |
| 5,446,313 A * | 8/1995 | Masuda et al. | ............ | 257/666 |
| 5,796,162 A * | 8/1998 | Huang | ............ | 257/676 |
| 5,929,513 A * | 7/1999 | Asano et al. | ............ | 257/675 |
| 6,025,642 A * | 2/2000 | Burns | ............ | 257/686 |
| 6,049,123 A * | 4/2000 | Burns | ............ | 257/686 |
| 6,087,586 A * | 7/2000 | Chen | ............ | 174/556 |
| 6,184,575 B1 * | 2/2001 | Chillara et al. | ............ | 257/692 |

\* cited by examiner

*Primary Examiner* — Alonzo Chambliss
(74) *Attorney, Agent, or Firm* — Yingsheng Tung; Wade J. Brady, III; Frederick J. Telecky, Jr.

(57) ABSTRACT

According to an embodiment of the invention, a system, operable to facilitate dissipation of thermal energy, includes a mold compound, a die, a first lead frame, and a second lead frame. The die is disposed within the mold compound, and in operation generates thermal energy. The first lead frame is disposed at least partially within the mold compound and is operable to facilitate transmission of a signal. The second lead frame is disposed at least partially within the compound, at least partially separated from the first lead frame, and is operable to facilitate a dissipation of thermal energy.

7 Claims, 5 Drawing Sheets

US 8,053,876 B2

MULTI LEAD FRAME POWER PACKAGE

CROSS-REFERENCE TO RELATED APPLICATIONS

This application is a continuation of application Ser. No. 11/831,458 filed Jul. 31, 2007, which is a divisional of application Ser. No. 11/074,278 filed Mar. 7, 2005, now abandoned which, pursuant to 35 U.S.C. §119 (e), claims priority from U.S. Provisional Patent Application Ser. No. 60/636,935, entitled MULTI LEADFRAME POWER PACKAGE (MLP2), filed Dec. 17, 2004.

TECHNICAL FIELD OF THE INVENTION

This invention relates generally to the field of semiconductor devices and, more particularly, to a multi lead frame power package.

BACKGROUND OF THE INVENTION

A packaged integrated circuit may generally include semiconductor chips and their associated components embedded within a molding. The packaged integrated circuits may be connected to a printed circuit board of an electronic device. Through the printed circuit board, the packaged integrated circuit may be connected to other chips and to external inputs and outputs. In operation, the components of the packaged integrated circuits create thermal energy, which dissipates in attempts to seek thermal equilibrium.

SUMMARY OF THE INVENTION

According to an embodiment of the invention, a system, operable to facilitate dissipation of thermal energy, includes a mold compound, a die, and a first lead frame. The die is disposed within the mold compound, and in operation generates thermal energy. The first lead frame is disposed at least partially within the mold compound. The first lead frame includes a wing that is external of the mold compound and is operable to receive thermal energy dissipated from the die through the first lead frame.

According to another embodiment of the invention, a system, operable to facilitate dissipation of thermal energy, includes a mold compound, a die, a first lead frame, and a second lead frame. The die is disposed within the mold compound, and in operation generates thermal energy. The first lead frame is disposed at least partially within the mold compound and is operable to facilitate transmission of a signal. The second lead frame is disposed at least partially within the compound, at least partially separated from the first lead frame, and is operable to facilitate a dissipation of thermal energy.

Certain embodiments of the invention may provide numerous technical advantages. For example, a technical advantage of one embodiment may include the capability to increase the efficiency of thermal dissipation away from a die in a packaged integrated circuit. Other technical advantages of other embodiments may include the capability to provide a metal attachment extending from a packaged integrated circuit to which a heat sink may attach; the capability to increase thermal dissipation throughput in a packaged integrated circuit; and the capability to allow flexibility in designing geometries to help spread thermal energy within and out of a packaged integrated circuit.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

For a more complete understanding of example embodiments of the present invention and its advantages, reference is now made to the following description, taken in conjunction with the accompanying drawings, in which.

DETAILED DESCRIPTION OF EXAMPLE EMBODIMENTS OF THE INVENTION

It should be understood at the outset that although example embodiments of the present invention are illustrated below, the present invention may be implemented using any number of techniques, whether currently known or in existence. The present invention should in no way be limited to the example embodiments, drawings, and techniques illustrated below, including the embodiments and implementation illustrated and described herein. Additionally, the drawings are not necessarily drawn to scale.

Figure 1:
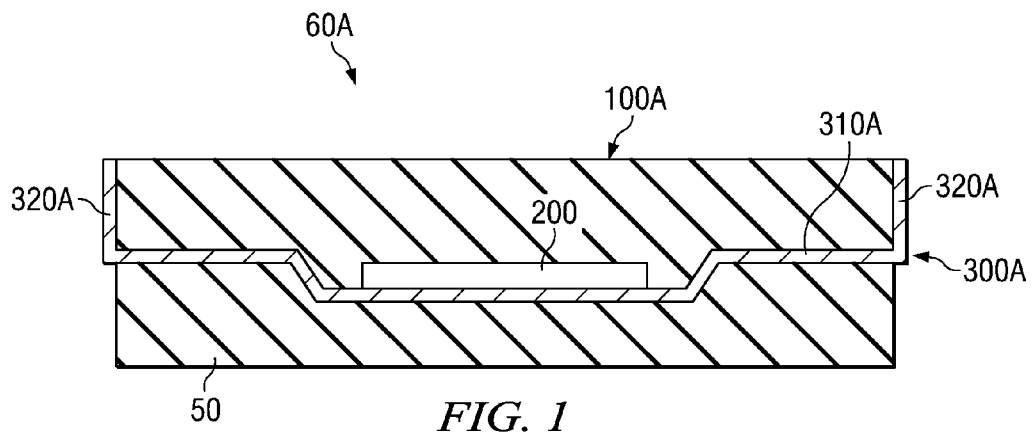
FIG. 1 is a side cross-sectional view of a system, according to an embodiment of the invention.

FIG. 1 is a side cross-sectional view of a system 60A, according to an embodiment of the invention. The system 60A in this embodiment generally includes a die 200 supported on and/or bonded to a pad 310A of a lead frame 300A. The die 200 and pad 310A are at least partially encapsulated in a mold compound 50 to form a packaged integrated circuit 100A. Encapsulation of the die 200 and the pad 310A with the mold compound 50 may be accomplished using a variety of semiconductor fabrication packaging techniques recognized by those of ordinary skill in the art. Although configurations of a packaged integrated circuit will be described with reference to embodiments herein, the packaged integrated circuit may include more, less, or different components than those described.

The die 200 may comprise a variety of materials including silicon, gallium arsenide, or other suitable substrate materials. The die 200 generally provide the foundation for a variety of semiconductor features, including but not limited to, analog and/or digital circuits such as digital to analog converters, computer processor units, amplifiers, digital signal processors, controllers, transistors, or other semiconductor features. Although not explicitly shown, the die 200 may be attached to the pad 310A, utilizing a variety of attachment mediums, including epoxy, polyimide, other adhesive chemistries, mixture of such chemistries, solder, a gold-silicon Eutectic layer, or other suitable material for bonding the die 200 to the pad 310A. In various embodiments, such attachment mediums may establish both a mechanical and thermal connection between the die 200 and pad 310A.

One generally recognized purpose of the mold compound 50 is to provide electrical isolation of semiconductor features formed in and/or on the die 200. Accordingly, the lead frame 300A may be utilized to facilitate the transfer of electrical signaling between the semiconductor features formed in and/or on the die 200 and a variety of other devices, for example, a printed circuit board. To this end, the lead frame 300A may be generally made from any suitable electrically conductive material, such as copper, aluminum, or other suitable materials. The pad 310A of the lead frame 300A may similarly be made of a variety of electrically conductive materials, including copper alloys, nickel alloys, aluminum, other suitable materials, or combinations of the preceding. While not explicitly shown in FIG. 1, the lead frame 300A may include leads to transfer such electrical signaling. Examples of such leads are discussed below in the embodiment described with reference to FIG. 8.

The pad 310A in this embodiment is shown protruding outside the mold compound 50 of the packaged integrated circuit 100A, forming wings 320A. The wings 320A of FIG. 1 are bent upwards in this embodiment; however, in other embodiments the wings 320A may be positioned in other directions. For example, the wings 320A may be bent down, bent at an angle, or left extending straight out. In some embodiments of the invention, during manufacture of the system 60A, the wings 320A extending outside a footprint area of the packaged integrated circuit 100 may be bent in the desired direction as opposed to being removed.

In operation, the semiconductor features formed in and/or on the die 200 generate thermal energy. The thermal energy generated by the die 200 in attempts to seek thermal equilibrium may generally dissipate through the mold compound 50. However, the mold compound typically has a relatively low thermal conductivity for the transfer of thermal energy in relation to other types of material. Additionally, ever-increasing power densities being utilized in semiconductor features formed in and/or on the die 200 increase the amount of thermal energy being created. Accordingly, teachings of embodiments of the invention take advantage of the thermal conductive properties of the pad 310A to dissipate thermal energy from the die 200 to the wings 320A. As the conductive path through the pad 310A may have a better thermal conductivity for the transfer of thermal energy than the mold compound 50, greater dissipation of thermal energy away from the die 200 may be accomplished. As will be recognized by one of ordinary skill in the art, the transfer of thermal energy may commonly be referred to as "heat".

Thermal energy dissipated to the wings 320A may dissipate into the air, other devices, or other suitable materials, some of which will be described below. As an example, in some embodiments, the wings 320A of the pad 310A may be bent down to contact a printed circuit board such that the printed circuit board operates as a heat sink for dissipation of the thermal energy away from the die 200.

Figure 2:
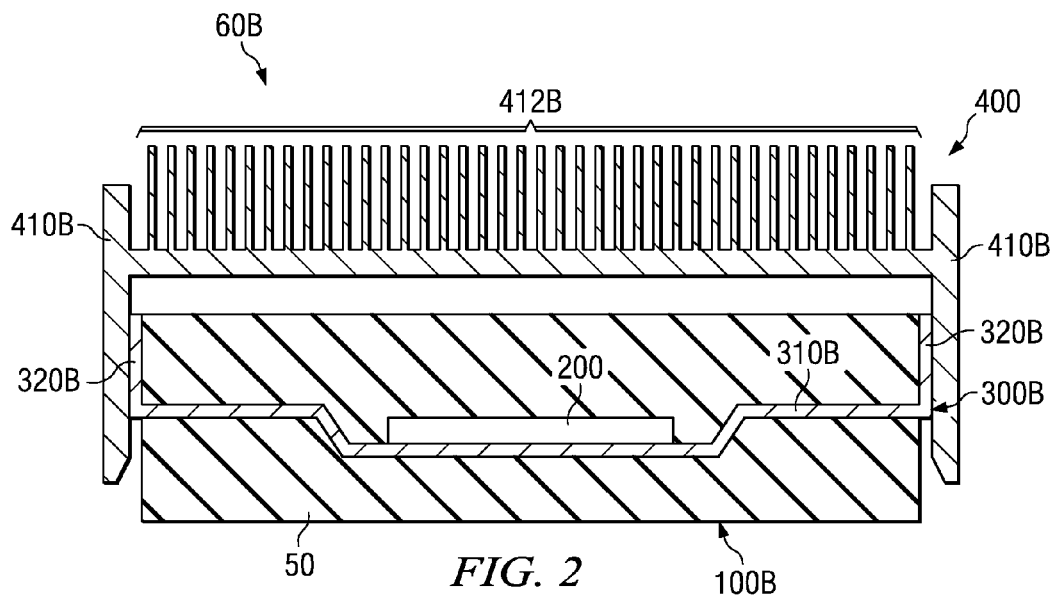
FIG. 2 is a side cross-sectional view of a system, according to another embodiment of the invention.

FIG. 2 is a side cross-sectional view of a system 60B, according to another embodiment of the invention. The system 60B of FIG. 2 is similar to the system 60A of FIG. 1, including a packaged integrated circuit 100B with mold compound 50, a die 200, a pad 310B, a lead frame 300B, and wings 320B. However, the system 60B of FIG. 2 includes a thermal dissipation system 400 coupled to the wings 320B on each side of the packaged integrated circuit 100B. Any of a variety of thermal dissipation systems may be utilized, including in some embodiments a metallic configuration or configurations utilizing fluid (e.g., systems utilizing circulated fluids). In this embodiment, the thermal dissipation system 400 is shown as a heat sink 410B with cooling fins 412B. Heat sinks are generally recognized by those of ordinary skill in the art. Any of a variety of configurations of heat sinks may be utilized, including in some embodiments, heat sinks with cooling fans. With the system 60B of FIG. 2, thermal energy may be dissipated from the die 200 through the pad 310B, the wings 320B, and to the heat sink 410B, where the cooling fins 412B facilitate transfer of the thermal energy to the air, other devices, or other suitable materials.

Figure 3:
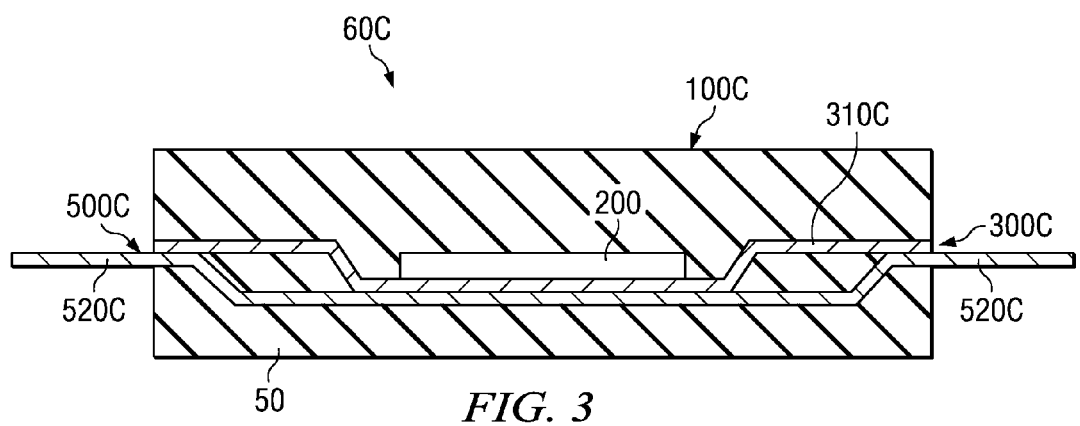
FIG. 3 is a side cross-sectional view of a system, according to yet another embodiment of the invention.
Figure 8:
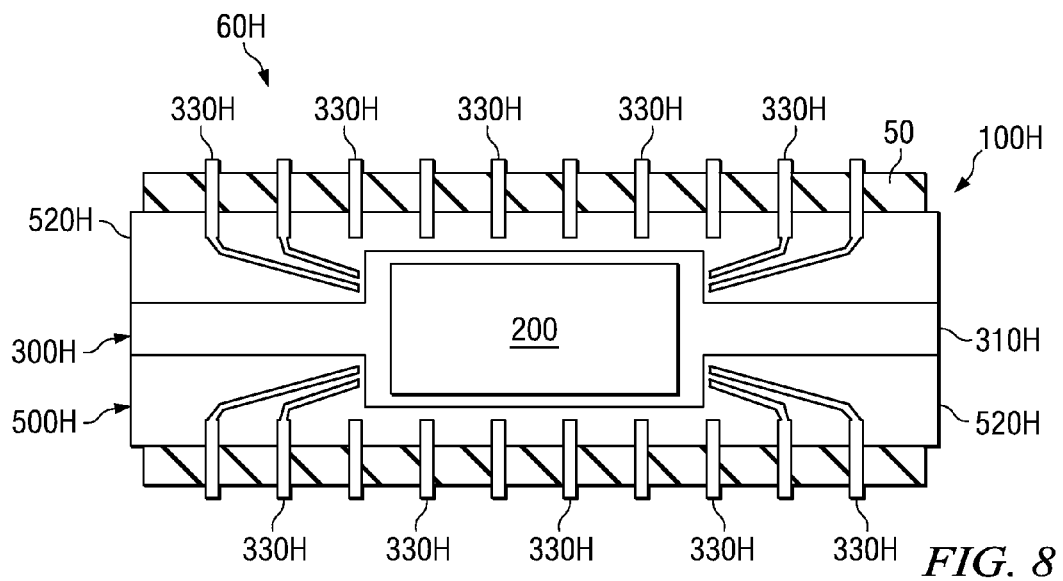
FIG. 8 is a cut away top view of a system, according to yet another embodiment of the invention.

FIG. 3 is a side cross-sectional view of a system 60C, according to yet another embodiment of the invention. The system 60C of FIG. 3 is similar to the system 60A of FIG. 1, including a packaged integrated circuit 100C with mold compound 50, a die 200, a pad 310C, and a lead frame 300C. However, the system 60C of FIG. 3 includes another lead frame 500C coupled below the lead frame 300C and disposed at least partially within the mold compound 50 of the packaged integrated circuit 100C. The lead frame 500C may generally be designed to dissipate thermal energy as opposed to carrying a signal. The lead frame 500C may be made of a variety of thermally conductive materials including, but not limited to, copper alloys, nickel alloys, aluminum, other suitable materials, or combinations of the preceding. In production of the packaged integrated circuit 100C the lead frame 500C may be added at the bottom of the pad 310 during the injection of mold compound 50 or prior to the injection of mold compound 50, utilizing a variety of objects, including clamps, glue, adhesive tape, soldering, thermal conductive attachment material, and other suitable materials. In the incorporation of lead frame 500C in proximity to lead frame 300C, one of ordinary skill in the art would recognize that the lead frames 300C, 500C, may be configured in a manner as to not disturb the electrical signals that may be carried by the leads of the lead frame 300C. FIG. 8 gives examples of a bend that may be utilized to preserve electrical signaling while facilitating thermal dissipation.

The lead frame 500C of FIG. 3, similar to the lead frame 300A of FIG. 1, generally protrudes outside the mold compound 50 of the packaged integrated circuit 100C, forming wings 520C. With system 60C of FIG. 5, thermal energy may be dissipated from the die 200 through the pad 310C and the lead frame 500C to the wings 520C. The additional conductive path provided by the lead frame 500C facilitates the transfer of thermal energy away from the die 200.

Although thermal conductivity generally tracks electrical conductivity for a large number of materials (e.g., metals), one of ordinary skill in the art will recognize that for some materials this may not the case. Accordingly, embodiments of the invention may take advantage of this phenomena to facilitate dissipation of thermal energy away from the die 200 while not interrupting electrical signaling.

Figure 4:
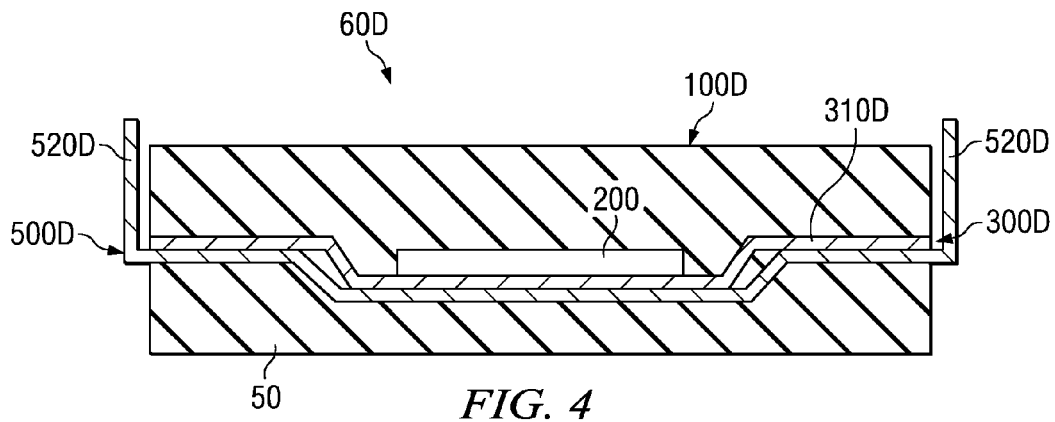
FIG. 4 is a side cross-sectional view of a system, according to yet another embodiment of the invention.

FIG. 4 is a side cross-sectional view of a system 60D, according to yet another embodiment of the invention. The system 60D of FIG. 3 may operate in a similar manner to the system 60C of FIG. 3, including a packaged integrated circuit 100D with mold compound 50, a die 200, a pad 310D, a lead frame 300D, a lead frame 500D, and wings 520D. However, in the system 60D of FIG. 4 the wings 520D are bent up at a distance from mold compound 50 of the packaged integrated circuit 100D. With the system 60D of FIG. 4, thermal energy may be dissipated from the die 200 through the pad 310D and the lead frame 500D to the wings 520D. The configuration of the wings 520D in this embodiment may facilitate connections to other devices, for example a heat sink.

Figure 5:
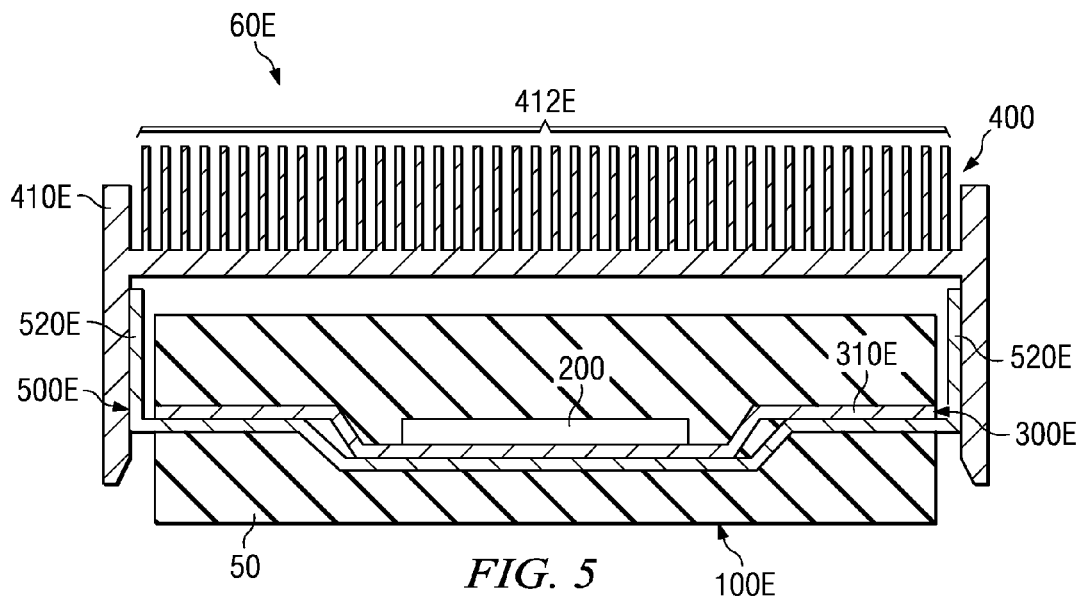
FIG. 5 is a side cross-sectional view of a system, according to yet another embodiment of the invention.

FIG. 5 is a side cross-sectional view of a system 60E, according to yet another embodiment of the invention. The system 60E of FIG. 5 may operate in a similar manner to the system 60D of FIG. 4, including a packaged integrated circuit 100E with mold compound 50, a die 200, a pad 310E, a lead frame 300E, a lead frame 500E, and wings 520E. However, the system 60E of FIG. 5 includes a thermal dissipation system 400 coupled to the wings 520E on each respective side of the packaged integrated circuit 100E. Similar to FIG. 2, any of variety of thermal dissipation systems may be utilized, including in some embodiments metallic configurations or configurations that utilize fluid. In this embodiment, the thermal dissipation system 400 is shown as a heat sink 410E with cooling fins 412E. With the system 60E of FIG. 5, thermal energy may be dissipated from the die 200 through the pad 310E, the lead frame 500E, and the wings 520E, to the heat sink 410E, where the cooling fins 412E facilitate transfer of the thermal energy to the air, other devices, or other suitable materials.

Figure 6:
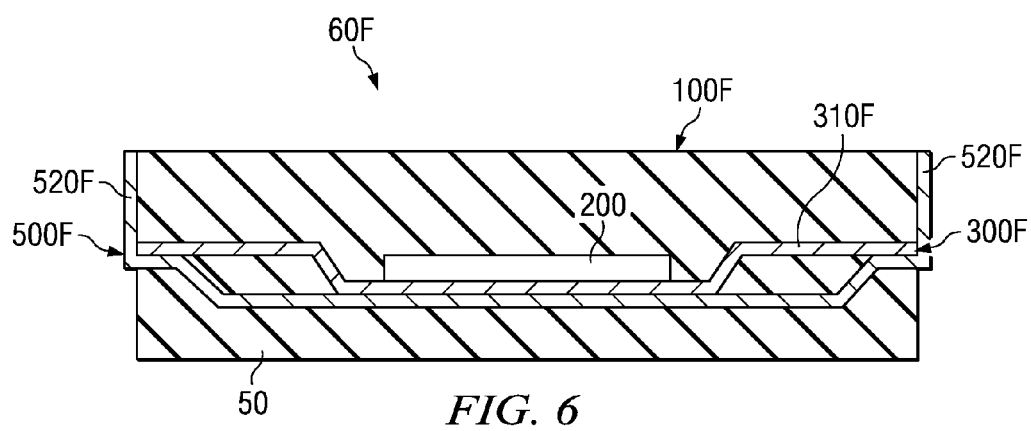
FIG. 6 is a side cross-sectional view of a system, according to yet another embodiment of the invention.

FIG. 6 is a side cross-sectional view of a system 60F, according to yet another embodiment of the invention. The system 60F of FIG. 6 may operate in a similar manner to the system 60D of FIG. 4, including a packaged integrated circuit 100F with mold compound 50, a die 200, a pad 310F, a lead frame 300F, a lead frame 500F, and wings 520F. However, the wings 520D are bent up flush against the mold compound 50 of the packaged integrated circuit 100F.

Figure 7:
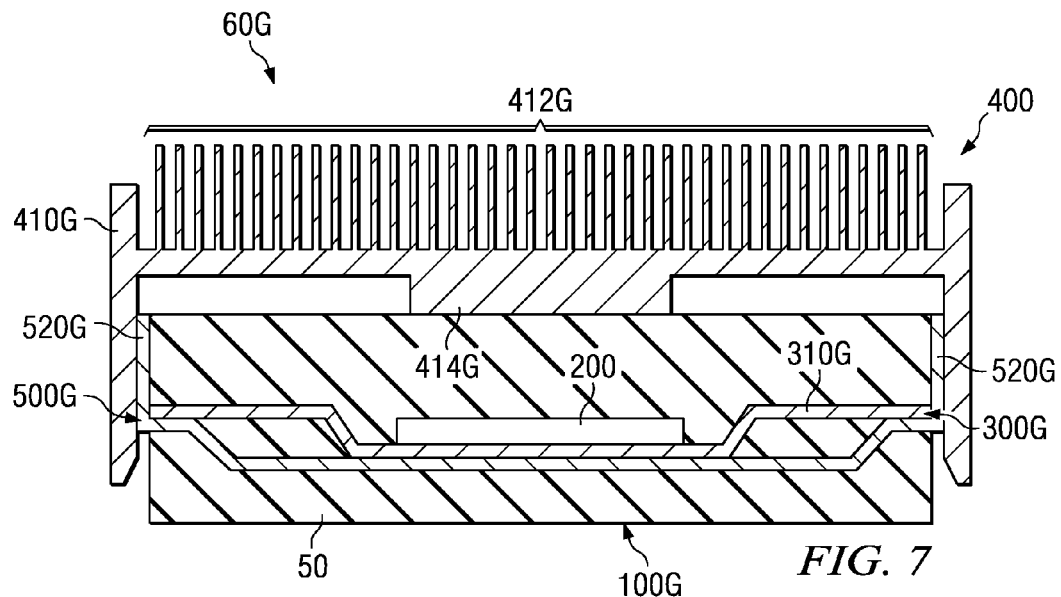
FIG. 7 is a side cross-sectional view of a system, according to yet another embodiment of the invention.

FIG. 7 is a side cross-sectional view of a system 60G, according to yet another embodiment of the invention. The system 60G of FIG. 7 may operate in a similar manner to the system 60E of FIG. 6, including a packaged integrated circuit 100G with mold compound 50, a die 200, a pad 310G, a lead frame 300G, a lead frame 500G, and wings 520G flush with the mold compound 50 of the packaged integrated circuit 100G. However, in FIG. 7, a thermal dissipation system 400 is coupled to the wings 520G on each respective side of the packaged integrated circuit 100G. Similar to FIGS. 2 and 5, any of a variety of thermal dissipation systems may be utilized, including in some embodiments metallic configurations or configurations that utilize fluid. In this embodiment, the thermal dissipation system 400 is shown as a heat sink 410G with cooling fins 412G and a contact piece 414G. The contact piece 414G facilitates dissipation of thermal energy traveling through the mold compound 50, for example, from the top of the die 200. With system 60G of FIG. 7, thermal energy may additionally be dissipated from the die 200 through the pad 310G, the lead frame 500G, and the wings 520G to the heat sink 410G where the cooling fins 412G facilitate transfer of thermal energy to the air, other devices, or other suitable materials.

FIG. 8 is a cut away top view of a system 60H, according to yet another embodiment of the invention. A portion of the compound 50 has been removed to illustrate features of the system 60H. The system 60H of FIG. 8 may operate in a similar manner to the system 60F of FIG. 6, including a packaged integrated circuit 100H with mold compound 50, a die 200, a pad 310H, a lead frame 300H, a lead frame 500H, and wings 520H. FIG. 8 also shows a configuration of leads 330H that may be utilized to facilitate electrical signaling between semiconductor features formed in and/or on the die 200 and other devices, for example, a printed circuit board. One of ordinary skill would understand that the lead frames 300H, 500H, may be configured in a variety of manner to preserve the electrical signals that may be carried by the leads 330H. For example, the leads 330H of the lead frame 300H may be bent as shown in FIG. 8.

By incorporating a lead frame 500H in addition to the signal carrying lead frame 300H, geometry constrictions may be avoided in some embodiments. For example, the lead frame 300H may require a particular geometry to carry an electrical signal while the lead frame 500H may require a completely different geometry designed to facilitate a dissipation of thermal energy. The separation and/or partial separation of the lead frame 300H and lead frame 500H may allow such configurations.

Figure 9:
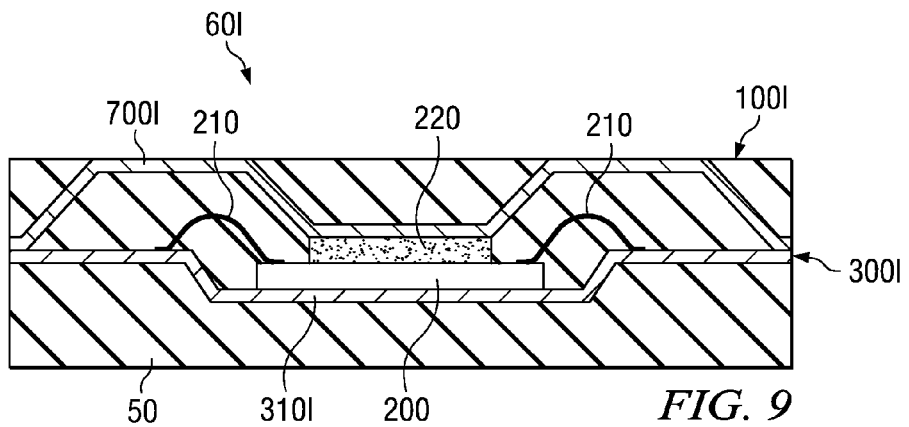
FIG. 9 is a side cross-sectional view of a system, according to yet another embodiment of the invention.

FIG. 9 is a side cross-sectional view of a system 60I, according to yet another embodiment of the invention. The system 60I of FIG. 9 may operate in a similar manner to the system 60F of FIG. 6, including a packaged integrated circuit 100I with mold compound 50, a die 200, a pad 310I, and a lead frame 300I. However, the system 60I of FIG. 9 includes a lead frame 700I above the lead frame 300I. The lead frame 700I in a manner similar to the lead frame 500C of FIG. 3 may generally be designed to dissipate thermal energy as opposed to carrying a signal. Accordingly, the lead frame 700I may be made of a variety of thermally conductive materials including, but not limited to, copper alloys, nickel alloys, aluminum, other suitable materials, or combinations of the preceding. Lead frame 700I may be thermally and mechanically coupled to the die 200 using an attachment material 220. A variety of different attachment materials 220 may be utilized, including but not limited to a liquid die attach, film tape-type die attach, thermal conductive die attach material, or other suitable materials. The attachment materials 220 in some embodiments may also act as a thermal expansion stress relief between the die 200 and the lead frame 700I. Coupled between the die 200 and the lead frame 300I in this embodiment is also a wire bond 210 that may be utilized to facilitate the transfer of electrical signaling. The attachment material 220 may be non-electrically conductive, to avoid interference with the operation of the features on the die 200. With the system 60I of FIG. 9, thermal energy may be dissipated from the die 200 through the attachment material 220 to the lead frame 700I where the thermal energy may either be transferred to the air, other devices, or other suitable materials. In some embodiments, the lead frame 700I may extend beyond the surface of the mold compound 50 while in other embodiment the lead frame 700I may not extend beyond the surface of the mold compound 50.

The lead frame 700I may be added to the top side of the die 200 in a variety of manners. For example, the lead frame 700I may be added after bonding of the wire bonds 220, but prior to molding, utilizing external clamping features to hold the lead frames 300I, 700I together. Other techniques may additionally be utilized as will be recognized by one of ordinary skill in the art.

Figure 10:
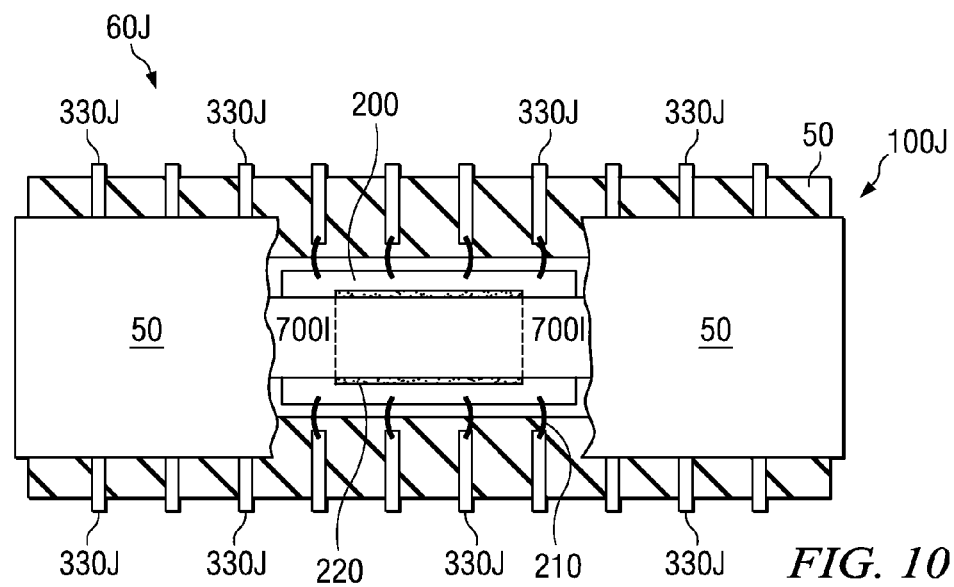
FIG. 10 is a cut away top view of a system, according to yet another embodiment of the invention.

FIG. 10 is a cut away top view of a system 60J, according to yet another embodiment of the invention. A portion of the mold compound 50 has been removed to illustrate features of the system 60J. The system 60J of FIG. 10 may operate in a similar manner to the system 60I of FIG. 9, including a packaged integrated circuit 100J with mold compound 50, a die 200, a pad 310J, a lead frame 300J, a lead frame 700J, attachment material 220 and wire bonds 210. FIG. 10 shows also a configuration of leads 330J.

Figure 11:
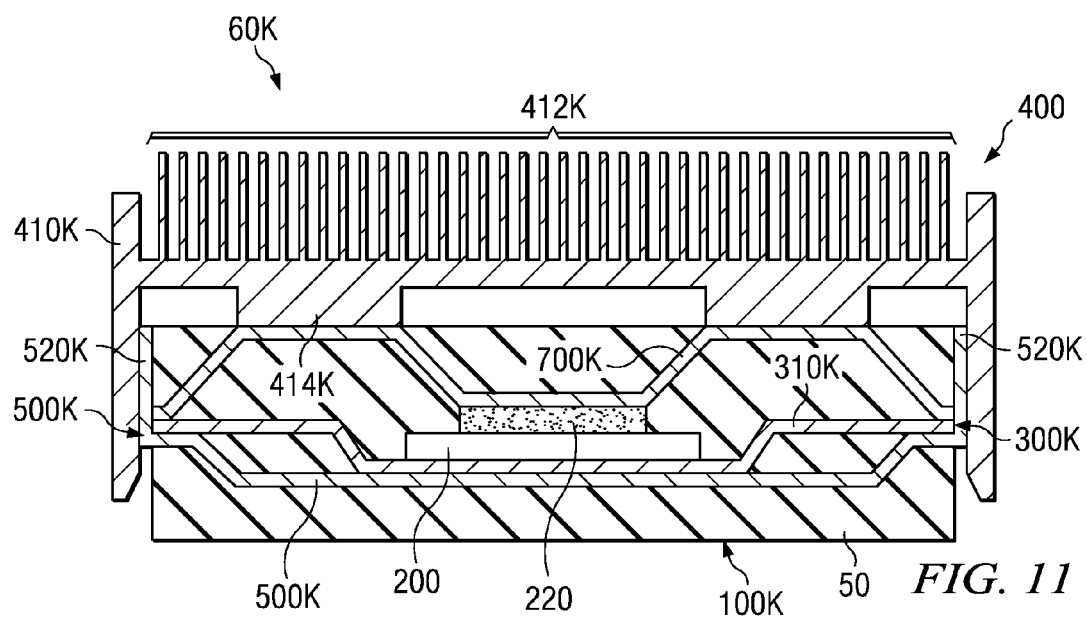
FIG. 11 is a side cross-sectional view of a system, according to yet another embodiment of the invention.

FIG. 11 is a side cross-sectional view of a system 60K, according to yet another embodiment of the invention. The system 60K of FIG. 11 may operate in a similar manner to the to features described in system 60H of FIG. 8 and system 60I of FIG. 9, including a packaged integrated circuit 100K with mold compound 50, a pad 310K, a lead frame 300K, a lead frame 500K, wings 520K, a lead frame 700K, attachment material 220, and a thermal dissipation system 400. Similar to description of FIGS. 2, 5, and 7, any of a variety of thermal dissipation systems may be utilized, including in some embodiments metallic configuration or configurations that utilize fluid. In this embodiment, the thermal dissipation system 400 is shown as a heat sink 410K with cooling fins 412K and a contact pieces 414K. With the system 60K of FIG. 11, thermal energy may be dissipated from the die 200 through the pad 310K, the lead frame 500K, and the wings 520K, to the heat sink 410K. Additionally, thermal energy may be dissipated from the die 200 through the attachment materials 220 and lead frame 700I, and contact pieces 416K of the heat sink 410K. Yet further paths of thermal dissipation may include dissipation from the die 200 through the attachment materials 220, the lead frame 700I, and the wings 520K to the heat sink 410K. At the heat sink 410K, the cooling fins 412K may facilitate transfer of the thermal energy to the air, other devices, or other suitable materials.

Figure 12A:
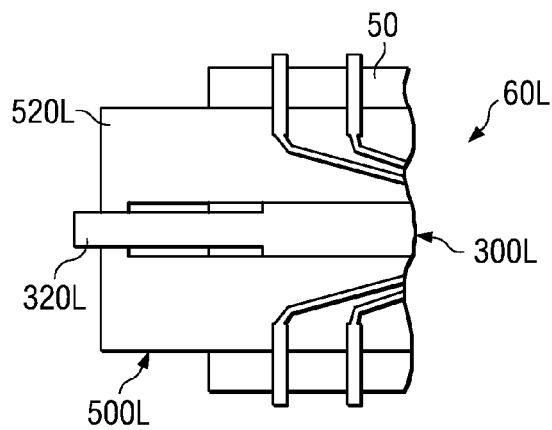
FIGS. 12A, 12B, and 12C are cut away top views illustrating a production of a system, according to an embodiment of the invention.
Figure 12B:
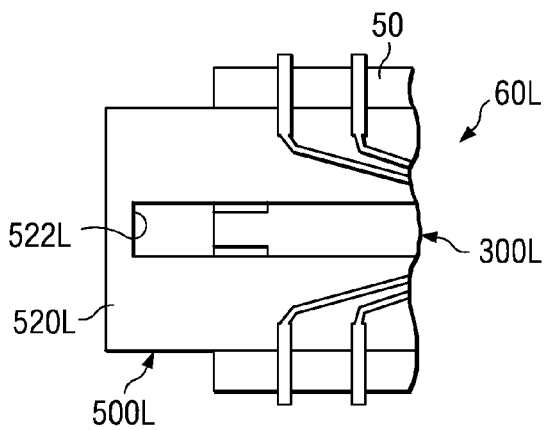
Figure 12C:
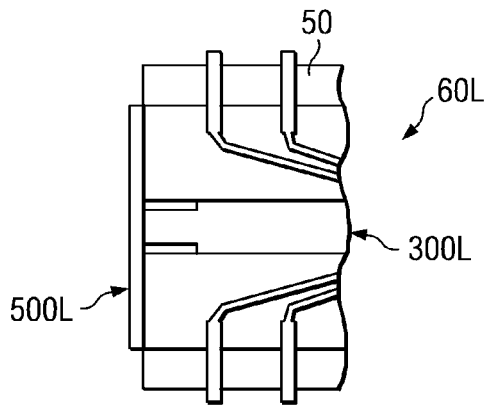

FIGS. 12A, 12B, and 12C are cut away top views illustrating a production of a system 60L, according to an embodiment of the invention. A portion of mold compound 50 has been removed to illustrate features of system 60L. FIG. 12A generally shows a portion of the system 60L after a molding process with mold compound 50. Lead frame 300L includes a wing 320L and lead frame 500L includes a wing 520L. FIG. 12B shows the system 60L after removing the wing 320L of the lead frame 300L to reveal an opening 522L in the lead frame 500L. Although such a removal of the wing 320L is described in this embodiment, in other embodiments the wing 320L may be retained. FIG. 12C shows the system 60L after a bending of the wing 520L up. Yet other methods of configuration may be utilized as will become apparent to one of ordinary skill in the art.

Figure 13A:
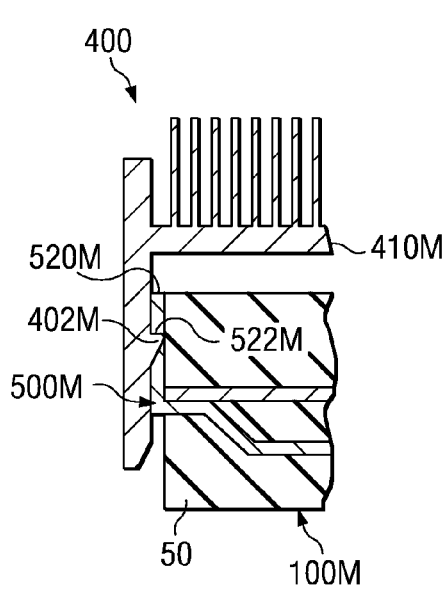
FIGS. 13A and 13B illustrate a configuration of coupling a thermal dissipation system to a packaged integrated circuit.
Figure 13B:
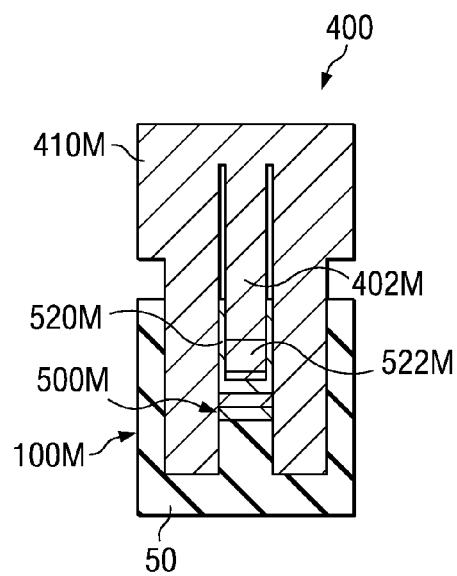

FIGS. 13A and 13B illustrate a configuration of a coupling of a thermal dissipation system 400 such as a heat sink 410M to a packaged integrated circuit 100M. In FIGS. 13A and 13B, an angled portion 402M of the heat sink 410M is unidirectionally latched in an opening 522M of the lead frame 500M. The opening 522M may generally be formed by the bending up of the wing 520M in the manner described above with reference to FIG. 12B and FIG. 12C. Although such a configuration has been shown in this embodiment, in other embodiments, a heat sink 410M may be attached to portions of the packaged integrated circuit in a variety of other manners. For example, the heat sink 410M may be attached with thermal epoxy or mechanically held with thermal grease. Yet other manners, techniques, and methods may be utilized.

Although the present invention has been described with several embodiments, a myriad of changes, variations, alterations, transformations, and modifications may be suggested to one skilled in the art, and it is intended that the present invention encompass such changes, variations, alterations, transformation, and modifications as they fall within the scope of the appended claims.

What is claimed is:

1. A semiconductor device, comprising:
a semiconductor chip encapsulated with a mold compound in a multiedged package;
metallic leads of a first thickness and a first width projected from a first non-adjacent package edges;
a conductive member connecting each lead to a contact point of the semiconductor chip; and
metallic wings of a second thickness and a second width wider than the first width extended outwardly from a pad to which the semiconductor chip is bonded, the metallic wings projected from a second non-adjacent package edges, bent approximately vertically with respect to a top surface of the package, and coupled to a heat sink with a mechanical locking means.

2. The semiconductor device of claim 1, in which the metallic leads are operable to transmit signals to and from the semiconductor chip.

3. The semiconductor device of claim 1, in which the first thickness is different from the second thickness.

4. The semiconductor device of claim 1, in which the first nonadjacent edges and the second non-adjacent edges are mutually orthogonal.

5. The semiconductor device of claim 1, in which the package has four edges.

6. The semiconductor device of claim 1, the mechanical locking means includes an angled portion on the heat sink.

7. The semiconductor device of claim 1, in which the conductive member includes a bond wire.

* * * * *